(12) United States Patent
Baldwin et al.

(10) Patent No.: US 6,610,179 B2
(45) Date of Patent: Aug. 26, 2003

(54) SYSTEM AND METHOD FOR CONTROLLING DEPOSITION THICKNESS USING A MASK WITH A SHADOW THAT VARIES WITH RESPECT TO A TARGET

(76) Inventors: David Alan Baldwin, 4803 Autumn Lake Way, Annadale, VA (US) 22003; Todd Lanier Hylton, 705 Crown Meadow Dr., Great Falls, VA (US) 22066

(*) Notice: Subject to any disclaimer, the term of this patent is extended or adjusted under 35 U.S.C. 154(b) by 0 days.

(21) Appl. No.: 09/810,388

(22) Filed: Mar. 16, 2001

(65) Prior Publication Data

US 2002/0131182 A1 Sep. 19, 2002

(51) Int. Cl.[7] ............................................. C23C 14/35
(52) U.S. Cl. .............................. 204/192.11; 204/192.13; 204/298.03; 204/298.04
(58) Field of Search ................. 204/192.11, 192.12, 204/192.13, 298.03, 298.04, 298.11, 298.28; 359/580, 581, 584, 585, 586, 587, 588

(56) References Cited

U.S. PATENT DOCUMENTS

| | | | |
|---|---|---|---|
| 3,904,503 A | 9/1975 | Hanfmann | 204/192.12 |
| 4,142,958 A * | 3/1979 | Wei et al. | 204/192.11 |
| 4,381,453 A | 4/1983 | Cuomo et al. | |
| 4,588,942 A | 5/1986 | Kitahara | 324/71.5 |
| 4,858,556 A | 8/1989 | Siebert | |
| 4,923,585 A | 5/1990 | Krauss et al. | |
| 5,427,671 A | 6/1995 | Ahmed | 204/298.23 |
| 5,707,501 A | 1/1998 | Inoue et al. | 204/298.11 |
| 5,891,311 A | 4/1999 | Lewis et al. | 204/192.12 |
| 6,063,436 A | 5/2000 | Pavell et al. | 427/162 |
| 6,086,727 A | 7/2000 | Pinarbasi et al. | |
| 6,168,832 B1 | 1/2001 | Boucher | 427/248.1 |

* cited by examiner

*Primary Examiner*—Rodney G. McDonald
(74) *Attorney, Agent, or Firm*—Morgan, Lewis & Bockius LLP

(57) ABSTRACT

A system and method for controlling a deposition thickness distribution over a substrate. A motor rotates the substrate, and at least one sensor senses the deposition thickness of the substrate at two or more radii on the substrate. An actuator varies a shadow of a mask disposed over a target used to sputter material on the substrate. An ion source generates an ion beam that is directed toward the target. The mask is positioned between the ion source and the target, and selectively blocks ion current from the ion source from reaching the target. A process controller is coupled to the deposition thickness sensor and the actuator. In response to the sensed deposition thickness, the process controller varies the shadow of the mask with respect to the target to control the deposition thickness distribution over the substrate.

3 Claims, 2 Drawing Sheets

SYSTEM AND METHOD FOR CONTROLLING DEPOSITION THICKNESS USING A MASK WITH A SHADOW THAT VARIES WITH RESPECT TO A TARGET

FIELD OF INVENTION

The present invention is directed generally to novel systems and methods for performing sputter deposition, and to optical devices manufactured using such systems and methods.

BACKGROUND OF THE INVENTION

It is believed that in vapor deposition systems such as ion beam sputtering, magnetron sputtering, diode sputtering, thermal evaporation, electron beam evaporation, pulse laser vaporization and cathodic arc vaporization, atoms or molecules ejected from a target material are directed toward a substrate where they condense to form a film. In most cases, the deposited film shows variation in thickness across the wafer that the user would like to eliminate (for uniform deposition) or control (thickness gradient) to meet the needs of a particular application. It would be beneficial to provide a system that improves control of the deposition thickness distribution over a wafer and from wafer-to-wafer during manufacturing runs.

SUMMARY OF THE INVENTION

The present invention is directed to a system and method for controlling a deposition thickness distribution over a substrate. The system comprises a motor that rotates the substrate and at least one sensor that senses the deposition thickness of the substrate at two or more radii on the substrate. An actuator varies a shadow of a mask disposed over a target used to sputter material on the substrate. An ion source generates an ion beam that is directed toward the target. The mask is positioned between the ion source and the target, and selectively blocks ion current from the ion source from reaching the target. A process controller is coupled to the deposition thickness sensor and the actuator. In response to the sensed deposition thickness, the process controller varies the shadow of the mask with respect to the target to control the deposition thickness distribution over the substrate.

The invention also includes an optical filter that is created by the disclosed systems and methods. The optical filter comprises a substrate, and material disposed on the substrate using the disclosed systems and methods.

BRIEF DESCRIPTION OF THE DRAWINGS

The accompanying drawings, which are incorporated herein and constitute part of this specification, illustrate presently preferred embodiments of the invention, and, together with the general description given above and the detailed description given below, serve to explain features of the invention. In the Drawings.

DETAILED DESCRIPTION OF THE PREFERRED EMBODIMENTS

Figure 1:
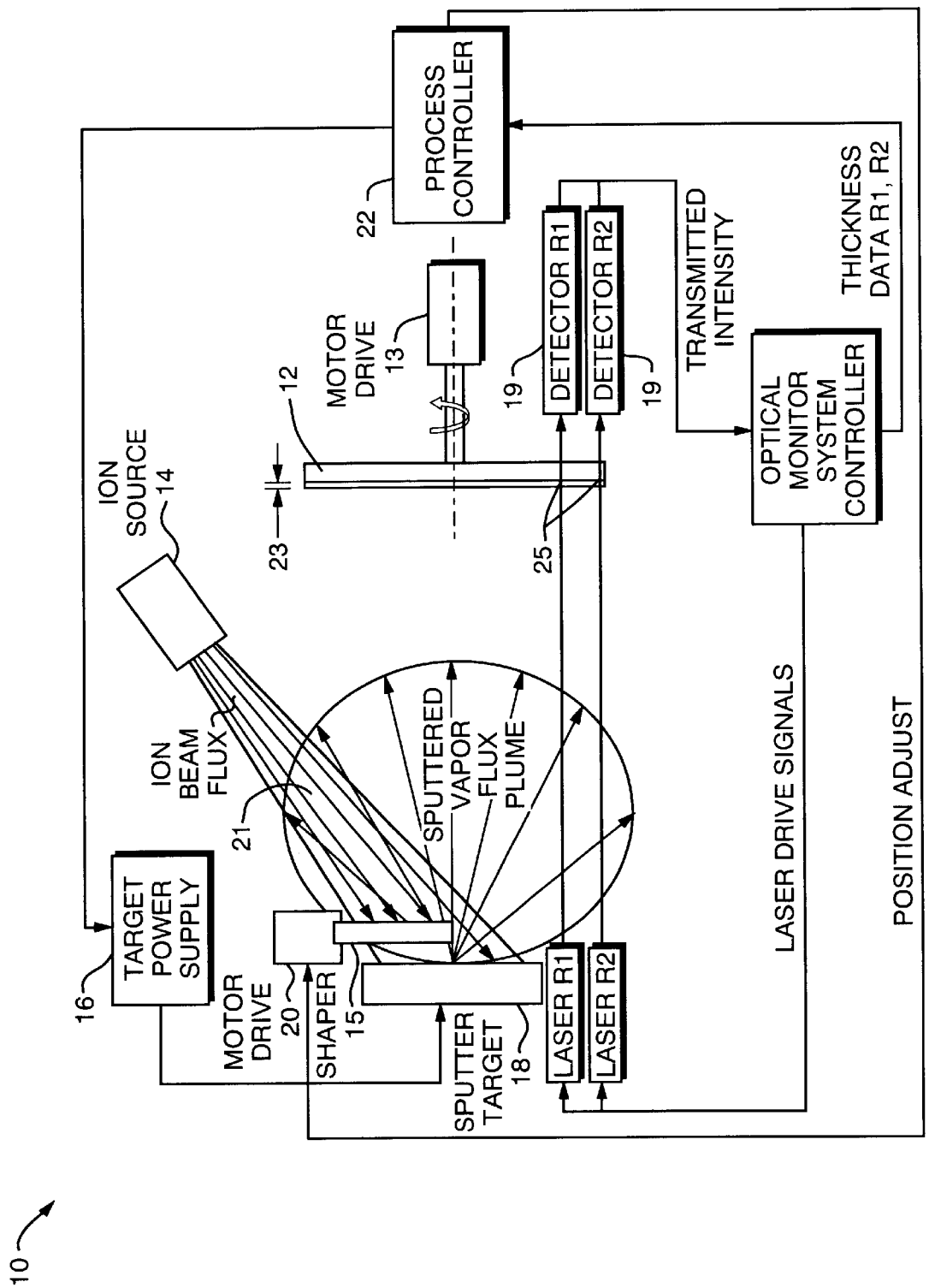
FIG. 1 is a diagram of a system for controlling the deposition thickness of a substrate using an actuator to vary a shadow of a mask over a target according to the present invention.

There is shown in FIG. 1 a system 10 for controlling a deposition thickness distribution over a substrate 12. The system 10 comprises a motor 13 that rotates the substrate 12. The axis of rotation is substantially perpendicular to the deposition surface of substrate 12. The system 10 further comprises at least one sensor 19 that senses the deposition thickness 23 of the substrate 12 at two or more radii 25 on the substrate 12. The system further comprises an actuator 20 that varies a shadow of a mask 15 disposed over a target 18. There is also a target power supply 16 that negatively biases the target 18 used to sputter material on the substrate 12.

An ion source 14 generates an ion beam 21 directed toward the negatively biased target 18. The mask 15 is positioned between the ion source 14 and the target 18. By varying the shadow of mask 15 over target 18, the invention selectively blocks ion current 21 from reaching the target 18. The ion source may be of the Hall-current-type or any ion source with a largely diffusive flux of ions out of a-region of concentrated plasma. These types of sources are based upon gaseous ionization and are able to provide amperes of charged particle current. The ion flux emitted from ion source 14 has a kinetic energy that is sufficiently low so as not to sputter the mask 15.

A process controller 22 is coupled to the motor 13, the thickness deposition sensor 19, the actuator 20, and the target power supply 16. During rotation of substrate 12, the process controller 22 varies the shadow of the mask 15 with respect to the target 18 to control the distribution of deposition thickness 23 over the surface of substrate 12. In particular, by varying the shadow of mask 15 with respect to target 10, the present invention selectively blocks ion current from ion source 14 from reaching the target 18. Thus, by varying the shadow of target 15, the present invention can vary the distribution of the ion current flux from ion source 14 that reaches target 18, and thereby vary the distribution of material sputtered from target 18 onto substrate 12. In one embodiment, the sputtering from target 18 is varied (by varying the shadow of mask 15) in response to thickness data provided by sensors 19, in order to maintain a uniform deposition thickness 23 distribution over the surface of substrate 12. In a further embodiment, the sputtering from target 18 is varied (by varying the shadow of mask 15) in response to thickness data provided by sensors 19, in order to maintain a deposition thickness 23 distribution that varies radially on the substrate but is substantially constant along a circumference of any given circle centered about the axis of rotation of the substrate.

In one embodiment, the process controller varies the shadow via the actuator by pivoting the mask about a pivot point that is laterally displaced from the axis of rotation of the substrate. In a further embodiment, the process controller via the actuator varies a corresponding shadow by "tilting" or rotating a mask about the central axis of the mask. In the latter embodiment the central axis of the mask may lie in a plane that is generally parallel with the plane of the target or in a plane which is generally parallel with the plane of the substrate. It will be understood by those skilled in the art that each shadow could be varied using a combination of the methods described above, or by moving masks in other ways such as along the radius of the target.

The present invention also includes a novel method for controlling a deposition thickness distribution over the surface of substrate 12. The method comprises rotating the substrate 12 with a motor 13, sensing the deposition thickness 23 of the substrate 12 at two or more radii 25 on the substrate 12 with a sensor 19, and varying a shadow of a mask 15 disposed over a target 18 with an actuator 20. Target 18 used to sputter material on the substrate 12 is negatively biased with a target power supply 16. An ion beam 21 is directed toward the target 18 with an ion source 14. In response to the sensed deposition thickness on the substrate, the process controller varies the shadow of the mask 15 with respect to the target 18 to control the deposition thickness distribution over the surface of the substrate 12.

Figure 2A:
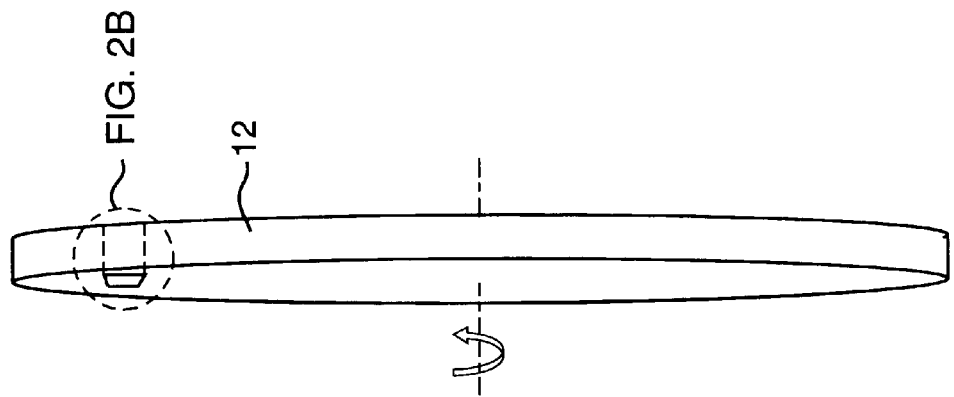
FIG. 2 illustrates an optical filter formed using the systems and methods for the present invention.
Figure 2B:
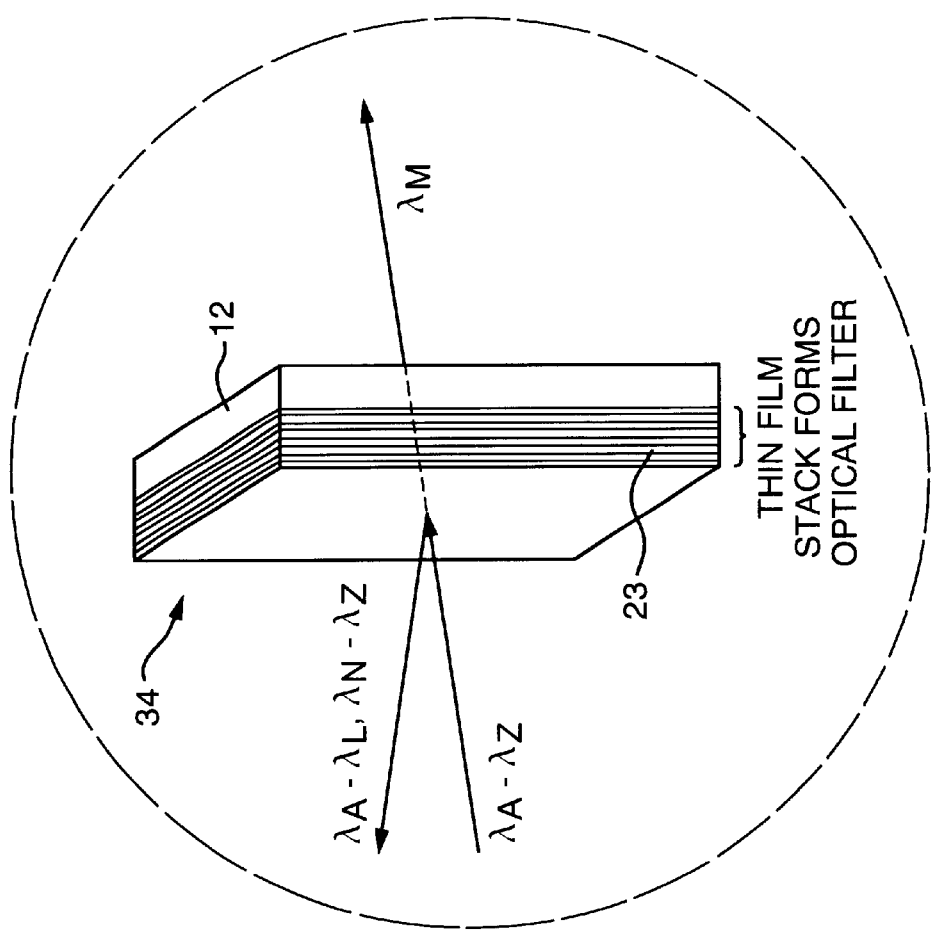

The system and process described above may be advantageously used to create an optical filter, such as filter 34 shown in FIG. 2. When the present invention is used to form an optical filter, the substrate 12 is preferably formed of a glass wafer, the material deposited on the substrate is alternating layers of tantalum oxide and silicon oxide, and the thickness of the material deposited on the substrate is low-order multiples and/or fractions of the optical thickness at the wavelength of light that the filter will serve to isolate. The filter 34 may be used in the form deposited or it may be further processed by sawing, grinding, trimming, back-thinning, polishing, mounting, bonding or other means to incorporate the filter into an optic assembly. It will be evident to practitioners of the art that substrates other than glass may be used, that smaller substrate pieces may be attached to the wafer 12 for deposition of filters on the smaller pieces, that deposited materials other than tantalum oxide and silicon oxide could be used for the filter, as long as the refractive index contrast was sufficiently large, and that a variety of differing optical stack designs might be employed to create a filter.

It will be appreciated by those skilled in the art that changes could be made to the embodiments described above without departing from the broad inventive concept thereof. It is understood, therefore, that this invention is not limited to the particular embodiments disclosed, but is intended to cover modifications within the spirit and scope of the present invention as defined in the appended claims.

What is claimed is:

1. A system for controlling a deposition thickness distribution over a substrate comprising:

(a) a motor that rotates the substrate;

(b) at least one sensor that senses the deposition thickness of the substrate at two or more radii on the substrate;

(c) an actuator that varies a shadow of a mask disposed over a target used to sputter material on the substrate;

(d) an ion source that generates an ion beam directed toward the target; wherein the mask is positioned between the ion source and the target, and the mask selectively blocks ion current from the ion source from reaching the target;

(e) a process controller coupled to the at least one deposition thickness sensor and the actuator, and (f) wherein, in response to a sensed deposition thickness, the process controller varies the shadow of the mask with respect to the target to control the deposition thickness distribution over the substrate.

2. The system of claim 1, further comprising a target power supply that negatively biases the target used to sputter material on the substrate.

3. A method for controlling a deposition thickness distribution over a substrate, comprising the steps of:

(a) rotating the substrate with a motor;

(b) sensing the deposition thickness of the substrate at two or more radii on the substrate with a sensor;

(c) varying, with an actuator, a shadow of a mask disposed over a target used to sputter material on the substrate (d) generating, with an ion source, an ion beam directed toward the target; wherein the mask is positioned between the ion source and the target, the mask selectively blocks ion current from the ion source from reaching the target, and a process controller is coupled to the deposition thickness sensor and the actuator; and (e) varying, with the process controller, the shadow of the mask with respect to the target to control the deposition thickness distribution over the substrate.

* * * * *